US010892180B2

(12) United States Patent
Chia et al.

(10) Patent No.: US 10,892,180 B2
(45) Date of Patent: Jan. 12, 2021

(54) LIFT PIN ASSEMBLY

(71) Applicant: APPLIED MATERIALS, INC., Santa Clara, CA (US)

(72) Inventors: Bonnie T. Chia, Sunnyvale, CA (US); Jallepally Ravi, San Ramon, CA (US); Manjunatha Koppa, Bangalore (IN); Vinod Konda Purathe, Bangalore (IN); Cheng-Hsiung Matthew Tsai, Cupertino, CA (US); Aravind Miyar Kamath, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 393 days.

(21) Appl. No.: 14/450,241

(22) Filed: Aug. 2, 2014

(65) Prior Publication Data
US 2015/0348823 A1 Dec. 3, 2015

Related U.S. Application Data

(60) Provisional application No. 62/006,846, filed on Jun. 2, 2014.

(51) Int. Cl.
*H01L 21/687* (2006.01)
*C23C 16/46* (2006.01)
(Continued)

(52) U.S. Cl.
CPC .. *H01L 21/68742* (2013.01); *H01L 21/67115* (2013.01); *H01L 21/6831* (2013.01); *C23C 16/46* (2013.01); *C30B 25/12* (2013.01)

(58) Field of Classification Search
CPC ......... H01L 21/68742; H01L 21/68785; H01L 21/68764; H01L 21/02049;
(Continued)

(56) References Cited

U.S. PATENT DOCUMENTS

| 725,662 A | * | 4/1903 | Bohlen | ............... E05B 65/0864 |
| | | | | 292/60 |
| 4,592,682 A | * | 6/1986 | Vanistendael | ............ B23Q 1/28 |
| | | | | 269/257 |

(Continued)

FOREIGN PATENT DOCUMENTS

| JP | 8279473 | | 10/1996 |
| JP | H08279473 | * | 10/1996 |

(Continued)

OTHER PUBLICATIONS

Torlon Design Manual—The High Performance Torlon Polymers.*
(Continued)

*Primary Examiner* — Tyrone V Hall, Jr.
*Assistant Examiner* — Mahdi H Nejad
(74) *Attorney, Agent, or Firm* — Moser Taboada

(57) ABSTRACT

Embodiments of lift pin assemblies are provided herein. In some embodiments, a lift pin assembly includes an elongate base formed of a first material and having a first feature formed in a distal end of the base to interface with and removably support a tip; and a tip formed of a second material different than the first material and having a support surface on a first side of the tip and an opposing second side of the tip, wherein the opposing second side includes a second feature to mate with the first feature of the base to removably retain the tip on the distal end of the base.

15 Claims, 5 Drawing Sheets

(51) Int. Cl.
  *H01L 21/683* (2006.01)
  *H01L 21/67* (2006.01)
  *C30B 25/12* (2006.01)

(58) Field of Classification Search
  CPC ......... H01L 21/02263; H01L 21/02312; H01L 21/02337; H01L 21/0262; H01L 21/205; H01L 21/67115; H01L 21/6831; H01L 21/68792; H01L 21/67103; H01L 21/6875; C23C 16/4586; C23C 16/458; C23C 16/4584; C23C 16/46; C30B 25/12
  USPC ..... 118/724, 728–732; 269/257, 289 R, 291, 269/266; 292/132, 98, 170, 124, 169.17, 292/229, 334; 156/345.51–345.55
  See application file for complete search history.

(56) References Cited

U.S. PATENT DOCUMENTS

| | | | | |
|---|---|---|---|---|
| 5,625,526 A * | 4/1997 | Watanabe | ............... | G03F 7/707 361/234 |
| 5,820,685 A * | 10/1998 | Kurihara | ............. | C23C 16/4583 118/729 |
| 5,834,737 A * | 11/1998 | Hirose | .................. | C03C 17/001 219/385 |
| 5,848,670 A * | 12/1998 | Salzman | .................... | B66F 7/00 187/272 |
| 6,146,463 A * | 11/2000 | Yudovsky | ........... | C23C 16/4583 118/728 |
| 6,148,762 A * | 11/2000 | Fukuda | ............... | C23C 16/4581 118/715 |
| 6,182,955 B1 * | 2/2001 | Kimble | ................. | B25B 11/005 269/21 |
| 6,227,786 B1 * | 5/2001 | Tateyama | .......... | H01L 21/67109 118/724 |
| 6,305,677 B1 * | 10/2001 | Lenz | ................... | H01L 21/6831 269/13 |
| 6,435,798 B1 * | 8/2002 | Satoh | .................. | C23C 16/4586 118/728 |
| 6,439,559 B1 * | 8/2002 | Kinnard | ................ | B25B 11/007 269/21 |
| 6,917,755 B2 * | 7/2005 | Nguyen | .............. | C23C 16/4581 118/50.1 |
| 7,557,905 B2 * | 7/2009 | Heo | .................... | H01L 21/6875 269/8 |
| 7,952,851 B2 * | 5/2011 | LaFontaine | ......... | H01L 21/6831 361/234 |
| 8,061,949 B2 * | 11/2011 | Kurita | .................... | C23C 14/566 414/217 |
| 8,778,083 B2 * | 7/2014 | Kim | .................. | C23C 16/45504 118/724 |
| 8,837,924 B2 * | 9/2014 | Tsunekawa | ....... | H01L 21/67109 118/724 |
| 8,998,191 B2 * | 4/2015 | Gao | ..................... | B62D 65/026 269/289 R |
| 9,011,602 B2 * | 4/2015 | Hao | ................... | H01L 21/6831 118/500 |
| 9,371,584 B2 * | 6/2016 | Kim | ..................... | C23C 16/458 |
| 2002/0046810 A1 * | 4/2002 | Tanaka | ............... | C23C 16/4401 156/345.51 |
| 2003/0205329 A1 * | 11/2003 | Gujer | .................... | C23C 16/405 156/345.51 |
| 2004/0045509 A1 * | 3/2004 | Or | ..................... | H01L 21/68742 118/729 |
| 2005/0155823 A1 * | 7/2005 | Hiroki | .................... | H01L 21/68 187/401 |
| 2005/0241767 A1 | 11/2005 | Ferris et al. | | |
| 2006/0130767 A1 * | 6/2006 | Herchen | ................ | G03B 27/32 118/728 |
| 2006/0156981 A1 | 7/2006 | Fondurulia et al. | | |
| 2007/0160507 A1 * | 7/2007 | Satoh | .................. | C23C 16/4586 422/135 |
| 2008/0102001 A1 * | 5/2008 | Chandrachood | .. | H01J 37/32935 422/129 |
| 2008/0124200 A1 * | 5/2008 | Lee | .................... | H01L 21/67259 414/217.1 |
| 2009/0209112 A1 * | 8/2009 | Koelmel | ........... | H01L 21/68742 438/795 |
| 2009/0314211 A1 * | 12/2009 | Du Bois | ........... | H01L 21/68742 118/729 |
| 2010/0019462 A1 * | 1/2010 | Chen | ...................... | B82Y 10/00 279/128 |
| 2010/0032096 A1 * | 2/2010 | Yu | ...................... | H01L 21/67103 156/345.52 |
| 2010/0086784 A1 * | 4/2010 | Patalay | ............. | H01L 21/68785 428/411.1 |
| 2011/0020545 A1 * | 1/2011 | Kim | .................. | C23C 16/45504 427/248.1 |
| 2011/0033620 A1 * | 2/2011 | Polyak | ................ | C23C 16/4586 427/248.1 |
| 2011/0315080 A1 * | 12/2011 | Choi | ................. | H01L 21/68742 118/723 E |
| 2013/0019802 A1 * | 1/2013 | Leck | ................. | C23C 16/45563 118/724 |
| 2014/0216332 A1 * | 8/2014 | Omori | ................. | C23C 16/4586 118/50 |
| 2014/0271081 A1 * | 9/2014 | Lavitsky | ........... | H01L 21/67103 414/744.2 |
| 2015/0170954 A1 | 6/2015 | Agarwal et al. | | |
| 2015/0224615 A1 * | 8/2015 | Ling | ........................ | B23Q 1/64 29/559 |
| 2016/0172227 A1 * | 6/2016 | Hanson | .................. | H02N 13/00 361/234 |
| 2017/0140975 A1 * | 5/2017 | Lee | ............................ | B08B 3/04 |
| 2019/0326154 A1 * | 10/2019 | Tsai | .................. | H01L 21/68785 |

FOREIGN PATENT DOCUMENTS

| | | |
|---|---|---|
| JP | H08279473 A * | 10/1996 |
| JP | 8313855 | 11/1996 |
| JP | 20007146 A | 1/2000 |
| JP | 2000007146 | * 1/2000 |
| JP | 2000007146 A * | 1/2000 |
| JP | 2001244243 | 9/2001 |
| JP | 2003100709 A | 4/2003 |
| JP | 2006344705 A | 12/2006 |
| JP | 2007189222 A | 7/2007 |
| WO | WO1993010321 A1 | 5/1993 |

OTHER PUBLICATIONS

International Search Report and Written Opinion dated Sep. 22, 2015 for PCT Application No. PCT/US2015/032905.
Search Report received from The State Intellectual Property Office Of The People's Republic of China for Chinese Applicaton No. 2015800268107 dated Nov. 23, 2017.

* cited by examiner

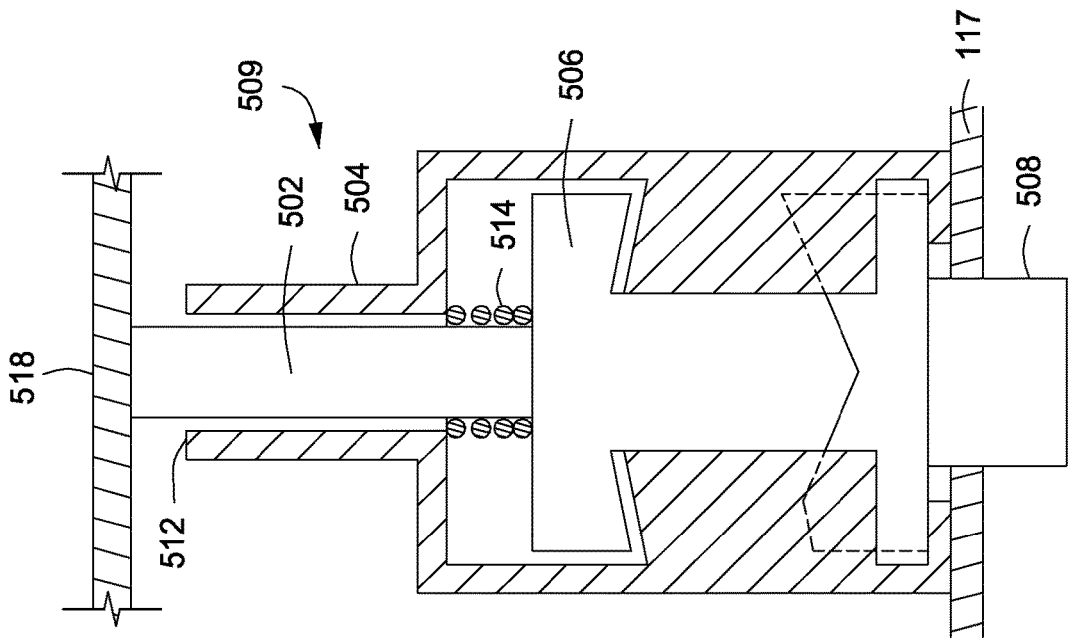
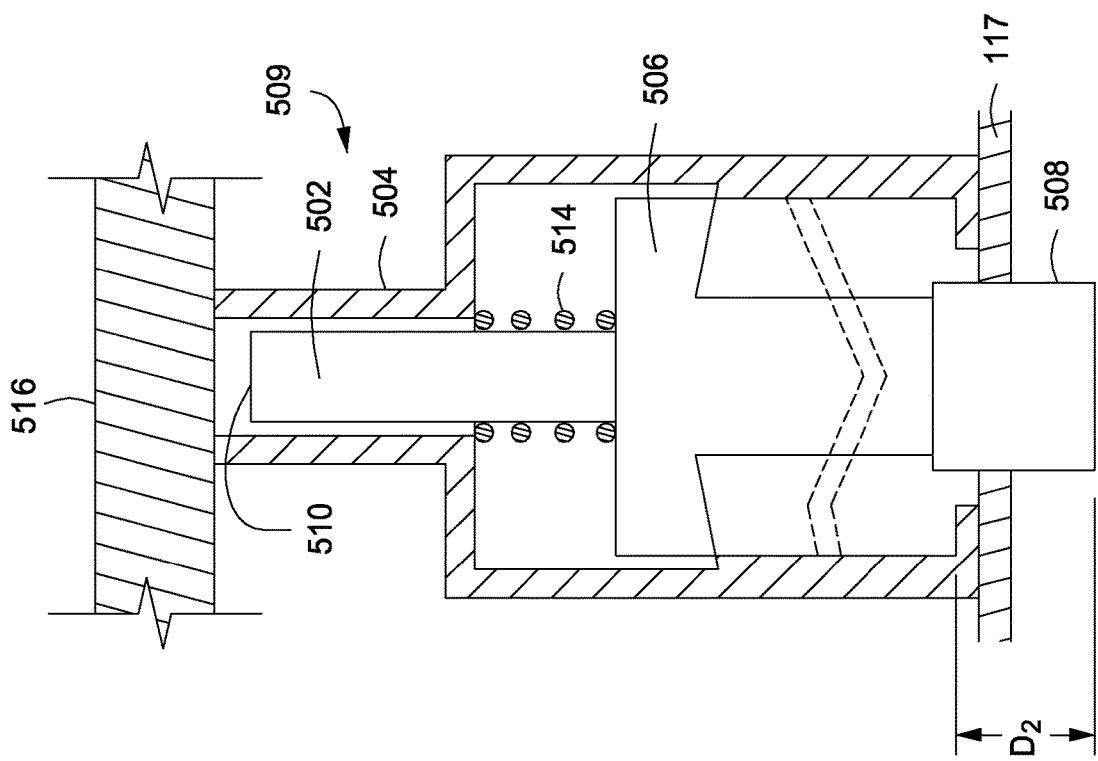

LIFT PIN ASSEMBLY

CROSS-REFERENCE TO RELATED APPLICATIONS

This application claims benefit of U.S. provisional patent application Ser. No. 62/006,846, filed Jun. 2, 2014, which is herein incorporated by reference in its entirety.

FIELD

Embodiments of the present disclosure generally relate to apparatus for handling a substrate.

BACKGROUND

Lift pins extend through a substrate support to lift a substrate off the substrate support to facilitate placement and removal of the substrate onto the substrate support. Conventionally, lift pins are formed of a metal to improve rigidity. The inventors have observed that impact between the substrate and metal surfaces results in particle generation on the substrate and in the processing chambers.

In some processes, to maintain process uniformity and ensure optimal performance of a processing chamber, a conditioning operation such as a pasting process is performed, in which a covering is applied over materials deposited on process chamber surfaces to prevent the deposited materials from flaking off the process chamber surfaces and contaminating the substrate during subsequent processes. During the pasting process, a shutter disk may be positioned atop a substrate support disposed in the process chamber to prevent the deposition of any materials upon the substrate support.

In addition, when a process chamber is opened, a target containing material to be deposited on a substrate may begin to oxidize. As such, a burn-in process may be performed to remove an oxide layer on the target. During the burn-in process, a shutter disk may be positioned atop a substrate support disposed in the process chamber to prevent the deposition of any materials upon the substrate support.

Although the inventors believe that eliminating hard lift pin surfaces altogether would address the issue of particle generation on a backside of the substrate, the inventors have observed that a hard surface is desirable for contacting the shutter disk, which is heavier and becomes hotter than the substrate.

Therefore, the inventors have provided an improved lift pin assembly.

SUMMARY

Embodiments an apparatus for handling a substrate are provided herein. In some embodiments, a lift pin assembly includes an elongate base formed of a first material and having a first feature formed in a distal end of the base to interface with and removably support a tip; and a tip formed of a second material different than the first material and having a support surface on a first side of the tip and an opposing second side of the tip, wherein the opposing second side includes a second feature to mate with the first feature of the base to removably retain the tip on the distal end of the base.

In some embodiments, a lift pin assembly includes a lift pin comprising a first material providing a first support surface and a second material providing a second support surface, wherein the first material is different than the second material, wherein the first material is an electrically conductive polymer, and wherein the second material is metallic.

In some embodiments, a substrate processing chamber includes a chamber body defining an inner volume; a substrate support disposed in the inner volume, the substrate support including a plurality of channels extending from a lower surface to an upper surface of the substrate support; and a plurality of lift pin assemblies to extend through the plurality of channels to facilitate placement or removal of a substrate or a shutter disk, each of the lift pin assemblies including a lift pin comprising a first material providing a first support surface and a second material providing a second support surface, wherein the first material is different than the second material, wherein the first material is an electrically conductive polymer, and wherein the second material is metallic.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIGS. 5A-B depict a lift pin assembly in accordance with some embodiments of the present disclosure.

Figure 1:
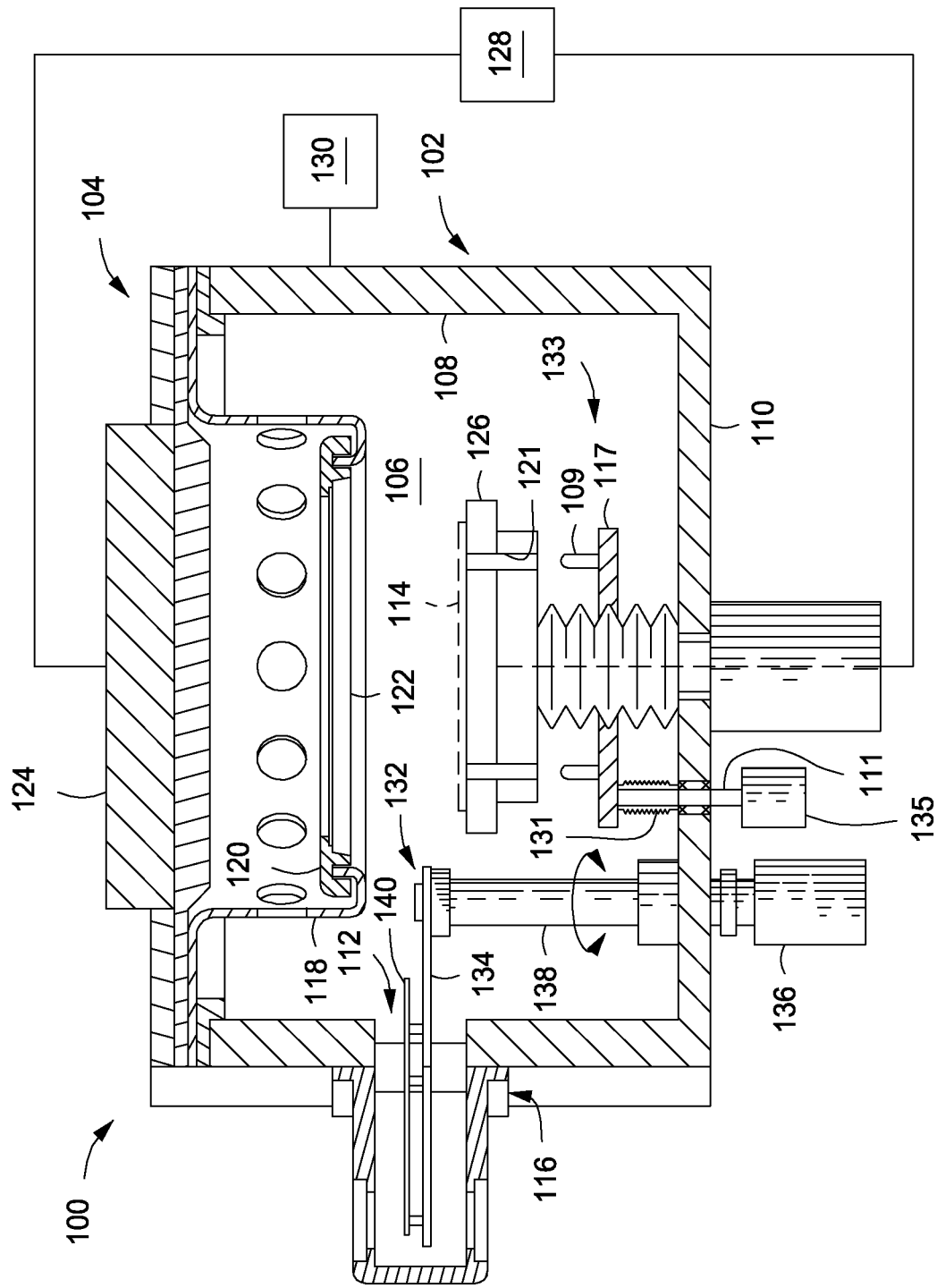
FIG. 1 depicts a process chamber suitable for use with a lift pin assembly in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of lift pin assemblies are provided herein. Embodiments of the lift pin assembly may advantageously decrease particle generation on a backside of a substrate while maintaining the capability of supporting a shutter disk when present. Embodiments of the inventive lift pin assembly may advantageously be easily retrofitted to existing processing systems, thereby avoiding unnecessary and costly modification of existing processing systems. Although useful for many substrate handling apparatuses, the apparatus disclosed below is illustratively described with respect to a physical vapor deposition (PVD) processing chamber.

FIG. 1 is a schematic diagram of an exemplary process chamber 100 for use in connection with some embodiments of the present disclosure. In some embodiments, the process chamber 100 may be one of a plurality of chambers combined to form a multi-chamber processing system (e.g., a cluster tool). Alternatively, the process chamber 100 may be a standalone process chamber. In some embodiments, the process chamber 100 may be a deposition chamber, for example, a PVD chamber. Alternatively, the process chamber 100 may be any suitable process chamber in which a shutter disk assembly may be used to protect the substrate support from damage during chamber/target cleaning and or seasoning processes.

The process chamber 100 includes a chamber body 102 and a lid assembly 104 that defines an evacuable process volume 106. The chamber body 102 generally includes one or more sidewalls 108 and a bottom 110. The one or more sidewalls 108 may be a single circular sidewall or multiple sidewalls in process chambers having non-circular configurations. The sidewalls generally contain a shutter disk assembly port 112. The shutter disk assembly port 112 is configured to allow at least a portion of a shutter disk assembly 140 therethrough when the shutter disk assembly 140 is in a retracted position. A housing 116 generally covers the shutter disk assembly port 112 to maintain the integrity of the vacuum within the process volume 106. Additional ports may be provided in the sidewalls, such as a sealable access port to provide for the entrance and egress of the substrate 114 from the process chamber 100. A pumping port may be provided in the sidewalls and/or the bottom of the chamber body 102 and is coupled to a pumping system that evacuates and controls the pressure within the process volume 106. In other embodiments, a shutter garage (not shown) located outside of process chamber 100 may store the shutter disk assembly 140 and move it into process chamber 100 through an opening (not shown) in process chamber 100.

The lid assembly 104 of the chamber body 102 generally supports an annular shield 118 that supports a shadow ring 120. The shadow ring 120 is generally configured to confine deposition to a portion of the substrate 114 exposed through the center of the shadow ring 120. The lid assembly 104 generally comprises a target 122 and a magnetron 124.

The target 122 provides material that is deposited on the substrate 114 during the deposition process while the magnetron 124 enhances uniform consumption of the target material during processing. The target 122 and substrate support 126 are biased relative each other by a power source 128. An inert gas, for example, argon, is supplied to the process volume 106 from a gas source 130. A plasma is formed between the substrate 114 and the target 122 from the gas. Ions within the plasma are accelerated toward the target 122 and cause material to become dislodged from the target 122. The dislodged target material is attracted towards the substrate 114 and deposits a film of material thereon.

The substrate support 126 is generally disposed on the bottom 110 of the chamber body 102 and supports the substrate 114 during processing. A lift pin assembly 133 may include a plurality of lift pins 109 mounted on a platform 117 connected to a shaft 111 which is coupled to a second lift mechanism 135 for raising and lowering the lift pin assembly 133 so that the substrate 114 or the shutter disk may be placed on or removed from the substrate support 126. The substrate support 126 includes channels 121 (e.g., thru-holes) to receive the lift pins 109. A bellows assembly 131 is coupled between the platform 117 and the bottom 110 to provide a flexible seal which maintains the chamber vacuum during vertical motion of the lift pin assembly 133.

A shutter disk assembly mechanism 132 is generally disposed proximate the substrate support 126. The shutter disk assembly mechanism 132 generally includes a blade 134 that supports the shutter disk assembly 140 and an actuator 136 coupled to the blade 134 by a shaft 138 to control the position of the blade 134.

The blade 134 may be moved between the retracted, or cleared, position shown in FIG. 1 and a second position that places the shutter disk assembly 140 substantially concentric with the substrate support 126. In the second position, the shutter disk assembly 140 may be transferred (by utilizing the lift pins) to the substrate support 126 during a target burn-in (in PVD chambers) and chamber pasting (in substrate preclean chambers) processes. The blade 134 is returned to the retracted position after the target burn-in and chamber pasting processes. The actuator 136 may be any device that may be adapted to rotate the shaft 138 through an angle that moves the blade 134 between the cleared and second positions. In other embodiments consistent with present disclosure, a robotic mechanism which positions a substrate 114 for processing may also be used to move the shutter disk assembly 140 in position to protect the substrate support 126.

Figure 2:
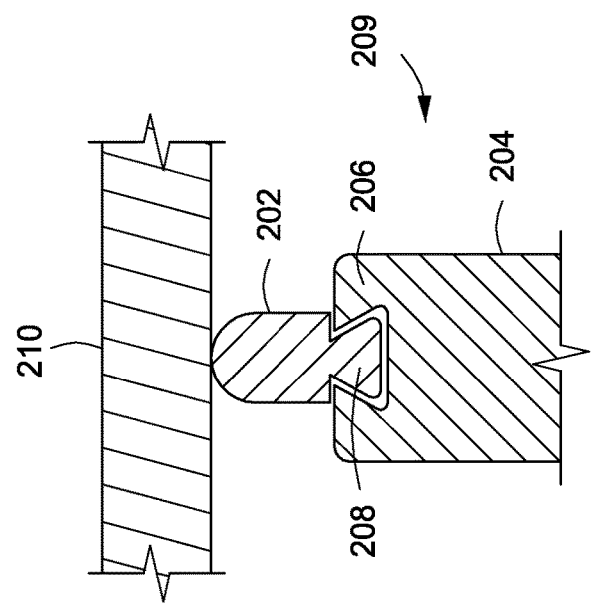
FIG. 2 depicts a lift pin assembly in accordance with some embodiments of the present disclosure.

FIG. 2 depicts a schematic view of an upper portion of a lift pin 209 in accordance with some embodiments of the present disclosure. The lift pin 209 includes an elongate base 204 with a first feature 206 at a distal end. The first feature 206 interfaces with and retains a tip 202 for supporting a substrate 210 or shutter disk (not shown) thereon. The tip 202 includes a second feature 208 that is sized and shaped to be held by the first feature 206. In some embodiments, the first feature 206 may be a collet and the second feature is a tapered surface to be inserted into and engaged by the collet to couple the tip 202 to the elongate base 204. In other embodiments, the second feature of the tip 202 may be threaded to engage corresponding threads in the first feature 206. In order to reduce particle generation on a backside of a substrate, the tip 202 is formed of an electrically conductive polymer such as, for example, CELAZOLE®, which can withstand temperatures of up to about 400° C. The elongate base 204 is formed of a metal such as, for example, stainless steel. Such a polymer advantageously prevents particle generation on the backside of a substrate while maintaining the ability to support a hot and, heavy shutter disk.

Figure 3A:
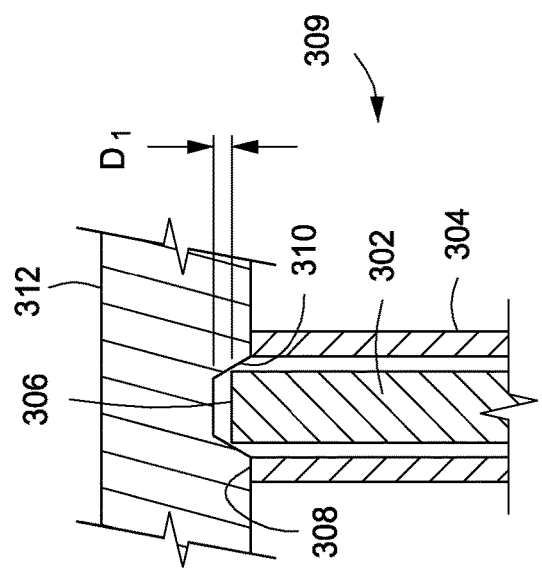
FIGS. 3A-B depict a lift pin assembly in accordance with some embodiments of the present disclosure.
Figure 3B:
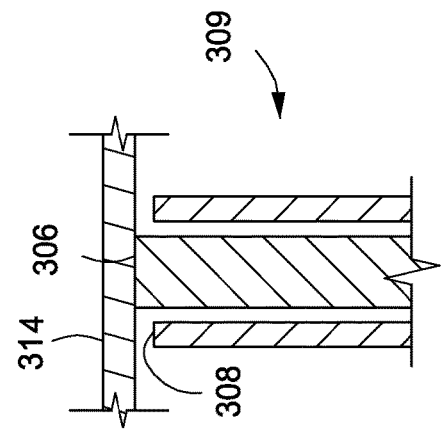

FIGS. 3A and 3B depict a schematic view of an upper portion of a lift pin 309 in accordance with some embodiments of the present disclosure. The lift pin 309 includes a pin 302 that extends through a sheath 304. The pin 302 is formed of a first material and the sheath 304 is formed of a second material different from the first material. In some embodiments, the first material is an electrically conductive polymer and the second material is metallic. The pin 302 provides a first support surface 306 for supporting a substrate thereon. The sheath 304 provides a second support surface 308 for supporting a shutter disk thereon. The pin 302 extends beyond the second support surface 308 so that the first and second support surfaces 306, 308 are offset. As depicted in FIG. 3A, the shutter disk 312 includes a recess, such as an annular groove 310, to advantageously center the shutter disk 312 on the lift pin assembly 133. The annular groove 310 is sized and shaped so that, when the shutter disk 312 is placed atop the lift pin assembly, the pin 302 extends into the annular groove 310 and is spaced apart from the shutter disk by a distance D1. In some embodiments, D1 may be at least 0.01 inches. As such, the shutter disk 312 rests on the second support surface 308 of the sheath 304. As depicted in FIG. 3B, when a substrate 314 is placed atop the lift pin assembly 133, the substrate 314 rests on the first support surface 306 of the pin 302. Because the pin 302 extends beyond the sheath 304, the substrate 314 never contacts the sheath 304, thereby avoiding particle generation on a backside of the substrate. In some embodiments, the first support surface 306 may be round shaped to reduce a contact area between the pin 302 and the substrate 314.

Figure 4B:
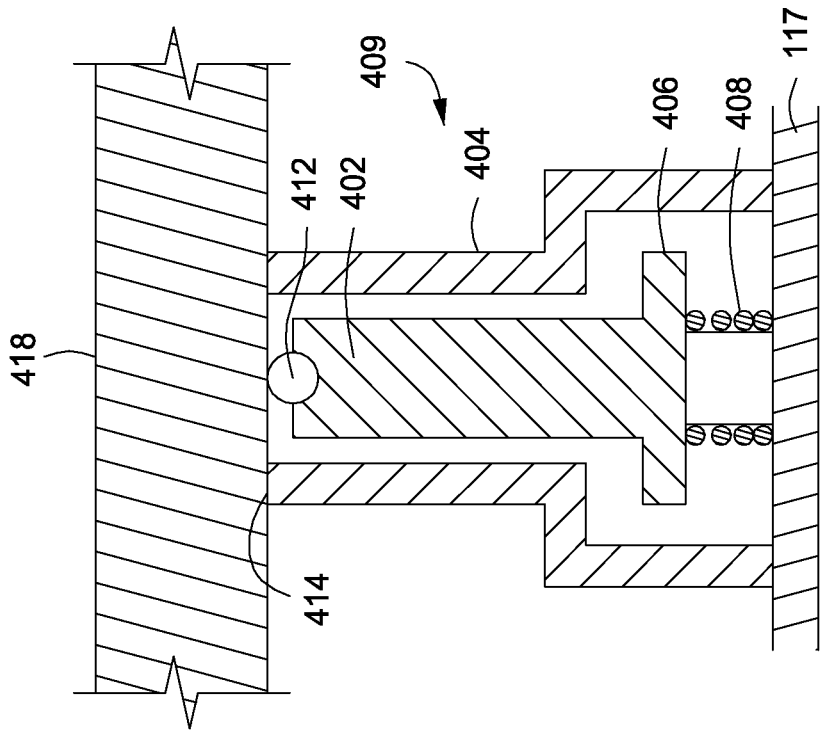
FIGS. 4A-B depict a lift pin assembly in accordance with some embodiments of the present disclosure.
Figure 4A:
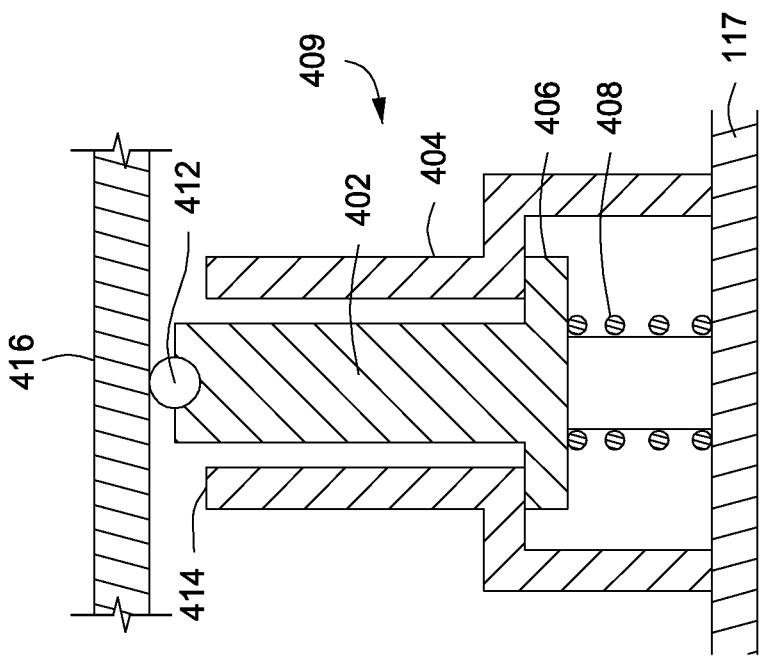

FIGS. 4A and 4B depict a schematic view of a lift pin 409 according to some embodiments of the present disclosure. The lift pin 409 includes a pin 402 that extends through a sheath 404. The pin 402 is formed of a first material and the sheath 404 is formed of a second material. In some embodiments, the first material is an electrically conductive polymer and the second material is metallic. In other embodiments, both the first and second materials are metallic (e.g., stainless steel). The pin 402 includes a collar 406, beneath which a spring 408 is disposed. The spring 408 extends between the collar 406 and the platform 117. When a substrate 416 is placed atop the lift pin 409, the spring 408 is in an uncompressed state. When a shutter disk 418 is placed atop the lift pin 409, the spring 408 is in a compressed state. The spring 408 is selected so that its spring constant is sufficient to support the weight of a substrate 416 and remain uncompressed. The specific spring constant required may be determined by the respective weights of the substrate 416 and the shutter disk 418 as well as the number of lift pins (e.g., three or more) that support the substrate 416 and shutter disk 418. When a shutter disk 418 is placed atop the pin 402, the weight of the shutter disk 418 compresses the spring 408 so that the shutter disk 418 rests on an upper support surface 414 of the sheath 404. A polymer tip 412 is disposed atop the pin 402. The polymer tip 412 advantageously prevents particle generation on a backside of the substrate 416 if the pin 402 is metallic. In some embodiments, the polymer tip 412 may be a ball.

FIGS. 5A and 5B depict a schematic view of a lift pin 509 according to some embodiments of the present disclosure. The lift pin 509 includes a pin 502 that extends through a sheath 504. The pin 502 is formed of a first material and the sheath 504 is formed of a second material different from the first material. In some embodiments, the first material is an electrically conductive polymer and the second material is metallic. The lift pin 509 also includes a locking mechanism 506 that moves the pin 502 to a raised (FIG. 5B) or lowered (FIG. 5A) position. The locking mechanism 506 includes an actuator 508 with a lower portion extending through the platform 117 and a spring 514 that biases the locking mechanism 506 towards the platform 117. To move the pin 502 to either of the two positions, the lift pin assembly 133 is lowered until the actuator 508 is pressed against the bottom 110 of the process chamber 100 and subsequently lifted off of the bottom 110. The actuator 508 has a length D2 that is long enough to contact the bottom 110 of the process chamber 100 when the lift pin assembly 133 is lowered, thereby depressing the actuator 508. As a result, the pin 502 is pushed upwards and then is lowered into a resting position (raised or lowered position). To move the pin 502 to the other position, the lift pin assembly 133 is lowered again until the actuator 508 is pressed against the bottom 110 of the process chamber 100 and subsequently lifted off of the bottom 110. When a substrate 518 is to be placed atop the lift pin 509, the locking mechanism 506 is actuated to move the pin 502 to the raised position so that the substrate 518 rests on a first support surface 510 of the pin 502 (FIG. 5B). When a shutter disk 516 is to be placed atop the lift pin 509, the locking mechanism 506 is actuated to move the pin 502 to the lowered position so that the shutter disk 516 rests on a second support surface 512 of the sheath 504 (FIG. 5A).

Figure 6:
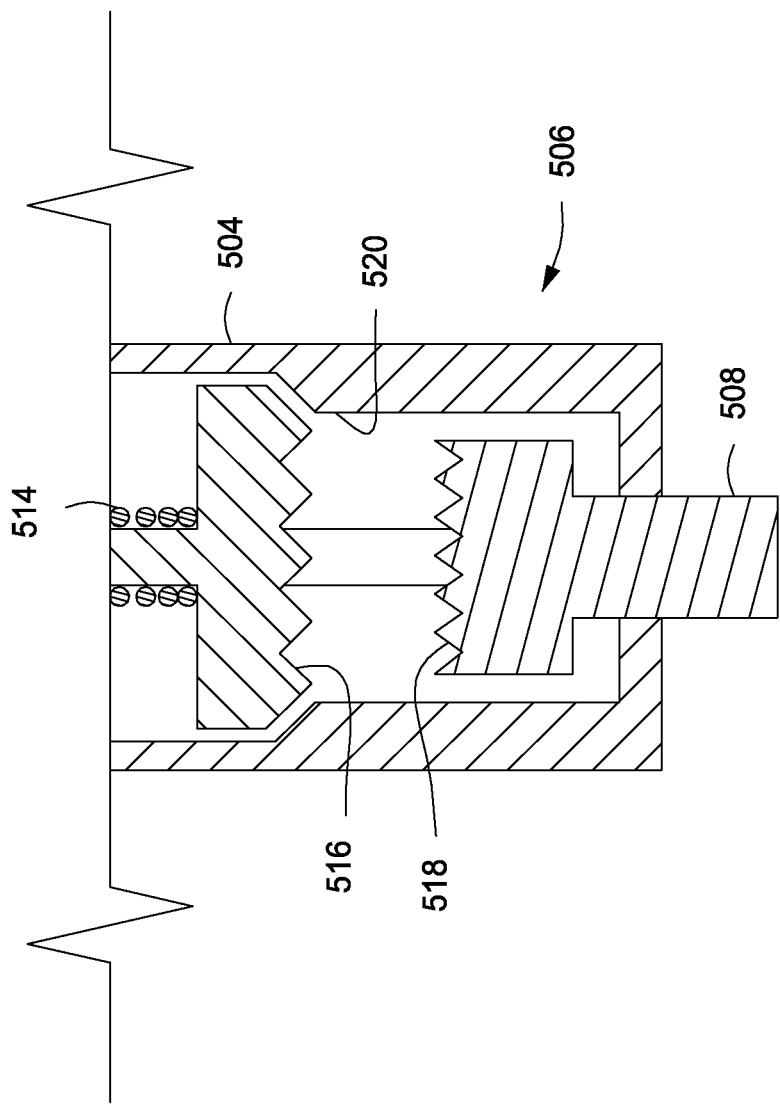
FIG. 6 depicts a cross sectional view of the lift pin assembly of FIGS. 5A-B in accordance with some embodiments of the present disclosure.

As illustrated in FIG. 6, the locking mechanism 506 includes a first cam 516 at a lower end of the pin that engages with a second cam 518 at an upper end of the actuator 508. The first cam 516 has a first profile and the second cam 518 has a second profile. An inner surface of the sheath 504 surrounding the first cam 516 includes a plurality of protrusions 520 separated by a plurality of channels. In the resting position (shown in FIG. 6), the first cam 516 rests on the plurality of protrusions 520 or extends into the plurality of channels. When the lift pin assembly 133 is lowered and the actuator 508 is pushed up, the second cam 518 is forced against the first cam 516, thereby pushing the pin 502 upward. The second profile of the second cam 518 is configured to rotate the first cam 516 (and the pin 502) when the second cam 518 engages the first cam 516. When the lift pin assembly 133 is raised, the spring 514 forces the pin 502 back to its resting position, in which the first cam 516 either rests against the plurality of protrusions 520 or extends into the channels between them. The rotation of the pin 502 facilitates the switching between the raised position and the lowered position of the pin 502 because the pin either rests on plurality of protrusions 520 or extends into the channels between them.

While the foregoing is directed to embodiments of the present disclosure, other and further embodiments of the disclosure may be devised without departing from the basic scope thereof.

The invention claimed is:

1. A system to lift an apparatus off of a substrate support, the system comprising:
   the substrate support;
   a platform independently movable with respect to the substrate support;
   a shutter disk that is rotatable and independently movable from a lift pin assembly, the substrate support, and the platform, wherein the shutter disk is configured to protect the substrate support from damage during a process; and
   the lift pin assembly including a sheath and a pin extending through the sheath, extending from the platform and comprising a first material providing a first upward support surface configured to support a substrate and a second material providing a second upward support surface configured to support the shutter disk, wherein the first material is different than the second material, wherein the first material is an electrically conductive polymer, wherein the second material is metallic, wherein the pin is formed of the first material and the sheath is formed of the second material and is configured to extend at least to an uppermost surface of the substrate support, wherein the sheath is directly mounted to a top surface of the platform, wherein the second upward support surface is disposed radially outward of the first upward support surface, wherein the first upward support surface is an upper surface of the pin and the second upward support surface is an upper surface of the sheath, and wherein the first upward support surface is above the second upward support surface.

2. The system of claim 1, wherein the first upward support surface extends into an annular groove in the shutter disk, when present, to allow the second upward support surface to support the shutter disk.

3. The system of claim 2, wherein the second material is stainless steel.

4. The system of claim 2, wherein the first upward support surface is spaced apart from the shutter disk, when present, by a distance of at least approximately 0.01 inches.

5. The system of claim 1, wherein the first upward support surface is rounded.

6. A system to lift an apparatus off of a substrate support, the system comprising:
the substrate support;
a platform independent of the substrate support;
a shutter disk that is rotatable and independently movable from a lift pin assembly, the substrate support, and the platform, wherein the shutter disk is configured to protect the substrate support from damage during a process; and
the lift pin assembly which includes:
a sheath and a pin extending through the sheath, extending from the platform and comprising a first material providing a first support surface and a second material providing a second support surface, wherein the first material is different than the second material, wherein the first material is an electrically conductive polymer, wherein the second material is metallic, and wherein the pin is formed of the first material and the sheath is formed of the second material;
a polymer tip disposed on an upper surface of the pin; and
a spring supporting a collar of the pin and moveable between a compressed state and an uncompressed state, wherein the spring is in the compressed state when the shutter disk is present above the lift pin assembly and in the uncompressed state when a substrate is present above the lift pin assembly.

7. The system of claim 6, wherein the first support surface is an upper surface of the polymer tip and the second support surface is an upper surface of the sheath.

8. The system of claim 7, wherein, in the compressed state, the first support surface is below the second support surface and, in the uncompressed state, the first support surface is above the second support surface.

9. A system to lift an apparatus off of a substrate support, the system comprising:
the substrate support;
a platform independent of the substrate support;
a shutter disk that is rotatable and independently movable from a lift pin assembly, the substrate support, and the platform, wherein the shutter disk is configured to protect the substrate support from damage during a process; and
the lift pin assembly which includes:
a sheath and a pin extending through the sheath, extending from the platform and comprising a first material providing a first support surface and a second material providing a second support surface, wherein the first material is different than the second material, wherein the first material is an electrically conductive polymer, wherein the second material is metallic, and wherein the pin is formed of the first material and the sheath is formed of the second material; and
a locking mechanism moveable between a first position and a second position, wherein, in the first position, the first support surface is below the second support surface so that the shutter disk, when present, rests on the second support surface, and
wherein, in the second position, the first support surface is above the second support surface so that a substrate, when present, rests on the first support surface.

10. The system of claim 9, wherein the locking mechanism comprises:
a first cam at a lower end of the pin, the first cam having a first profile;
an actuator including a lower portion extending through the platform and an upper portion including a second cam having a second profile; and
a plurality of protrusions disposed on an inner surface of the sheath and separated by a plurality of channels.

11. The system of claim 10, wherein the pin rests on the plurality of protrusions in the second position and extends into the plurality of channels in the first position.

12. The system of claim 11, wherein the actuator is depressed by a bottom of a process chamber when the lift pin assembly is lowered.

13. The system of claim 12, wherein the first and second profiles are configured so that when the actuator is depressed, the second cam is forced against the first cam and the pin is lifted and rotated to move the pin from the plurality of channels to the plurality of protrusions or from the plurality of protrusions to the plurality of channels.

14. The system of claim 9, further comprising:
a polymer tip disposed on an upper surface of the pin.

15. A substrate processing chamber, comprising:
a chamber body defining an inner volume;
a substrate support disposed in the inner volume, the substrate support including a plurality of channels extending from a lower surface to an uppermost surface of the substrate support;
a shutter disk that is rotatable and independently movable from a lift pin assembly, the substrate support, and the platform, wherein the shutter disk is configured to protect the substrate support from damage during a process; and
a plurality of lift pin assemblies to extend through the plurality of channels, wherein each lift pin assembly comprises a pin with a first material providing a first support surface configured to directly support a substrate and a sheath with a second material providing a second support surface configured to directly support the shutter disk, wherein the first material is different than the second material, wherein the first material is an electrically conductive polymer, wherein the second material is metallic, and wherein the second support surface is extendable to at least the uppermost surface of the substrate support.

* * * * *

UNITED STATES PATENT AND TRADEMARK OFFICE
CERTIFICATE OF CORRECTION

Page 1 of 1

PATENT NO. : 10,892,180 B2
APPLICATION NO. : 14/450241
DATED : January 12, 2021
INVENTOR(S) : Bonnie T. Chia et al.

It is certified that error appears in the above-identified patent and that said Letters Patent is hereby corrected as shown below:

In the Specification

Column 5, in Line 11, delete "48" and replace with "4B"
Column 5, in Line 67, delete "(FIG. 58)." and replace with "(FIG. 5B)."

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*